United States Patent [19]

Strammello, Jr.

[11] 4,271,529
[45] Jun. 2, 1981

[54] TUNABLE RESONANT CIRCUITS FOR A MULTI-BAND VHF/UHF/CATV TUNER

[75] Inventor: Peter Strammello, Jr., Arlington Heights, Ill.

[73] Assignee: Zenith Radio Corporation, Glenview, Ill.

[21] Appl. No.: 132,348

[22] Filed: Mar. 20, 1980

[51] Int. Cl.³ .............................................. H04B 1/16
[52] U.S. Cl. ................................... 455/180; 455/191; 455/188; 334/15
[58] Field of Search ............... 455/180, 187, 188, 189, 455/191, 176, 178, 168, 314; 334/14, 15, 18, 42; 358/191.1

[56] References Cited
U.S. PATENT DOCUMENTS

| | | | |
|---|---|---|---|
| 3,564,423 | 2/1971 | Putzer | 455/191 |
| 3,611,154 | 10/1971 | Kupfer | 455/180 |
| 3,628,152 | 2/1970 | Carlson | 455/195 |
| 3,646,450 | 2/1972 | Ma | 455/180 |
| 3,727,140 | 4/1973 | Rodrigalvarez | 455/191 |
| 3,903,487 | 9/1975 | Maier | 455/191 |
| 3,931,578 | 1/1976 | Gittinger | 455/189 |
| 3,942,122 | 3/1976 | Nakanishi | 455/180 |
| 4,002,986 | 1/1977 | Ma | 455/180 |
| 4,115,737 | 9/1978 | Hongu | 455/191 |

Primary Examiner—Robert L. Griffin
Assistant Examiner—Tommy P. Chin
Attorney, Agent, or Firm—Thomas E. Hill

[57] ABSTRACT

A conventional varactor tuned VHF/UHF television tuner with additional inductors placed in parallel in each VHF tuned circuit by means of diode switching provides an additional tuning capability over the CATV Superband. Selective tuning to any broadcast channel within the VHF, UHF and CATV bands is achieved by voltage-controlled tunable circuitry such as the type employing varactor diodes responsive to an adjustable DC tuning voltage having unique levels assigned to the various desired channels. By providing an additional bandswitching input voltage to a conventional tuner, Superband coils are diode-switched in parallel with VHF tuned circuits permitting an expanded tuning frequency range. This parallel coil approach in achieving Superband coverage permits the utilization of spring-wound VHF-band and Superband coils to facilitate tuning circuit alignment and to eliminate the need for a discrete Superband tuner or a CATV converter.

7 Claims, 2 Drawing Figures

TUNABLE RESONANT CIRCUITS FOR A MULTI-BAND VHF/UHF/CATV TUNER

BACKGROUND OF THE INVENTION

This invention relates generally to voltage-controlled tuning systems for tuning a television receiver to a desired channel and specifically to a single tuner circuit for tuning to all VHF/UHF/CATV channels without utilizing an accessory band converter.

The tuner in a typical electronically tuned television receiver includes the following four tunable stages: an antenna input, or RF, amplifier stage, an RF output amplifier stage, a mixer input stage, and a tuned oscillator stage. Each stage is tuned to resonate at a given frequency representing the desired channel. All stages are tuned simultaneously and in combination form a multi-stage tunable circuit.

A voltage-controlled tuner includes, in each of the aforementioned tunable resonant circuits, a variable reactance device that tunes the circuit to different channels in response to changes in amplitude of a DC control, or tuning, voltage applied to the device. Usually, each of these devices takes the form of a voltage-controlled variable capacitance diode, commonly called a varacter or varicap diode, the capacitance of which is determined by the magnitude of the applied tuning voltage. As the tuner is actuated to different positions, the applied voltage level varies in order to change the resonant frequency of each tunable circuit to effect tuning to different channels.

When more than one frequency band is to be covered by the tuner, bandswitching may be achieved by using a variety of different approaches, while permitting the varactor diodes to be common to and used in each band. For example, for each band a different inductance coil may be mechanically switched into each tunable circuit. As another example, each tunable circuit may comprise a sectionalized inductance coil with different sections being shorted out by mechanical switches for tuning to different bands. To avoid the translation of RF signals through the mechanical switches in the last example, electronic switching or gating devices may be used. Typically used in such applications are diodes which are capable of being turned ON by one magnitude-polarity condition of the switching voltage and turned OFF in response to another magnitude-polarity condition.

An approach employing this varactor-controlled tuning technique in combination with diode bandswitching is disclosed in U.S. Pat. No. 3,646,450. Therein is described a system capable of electronically switching between low (channels 2-6) and high (channels 7-13) VHF tuning bands. This is accomplished by selectively switching an inductive coil in and out of each of the four tunable stages by applying one of two input voltages to the diode. Individual channel tuning is accomplished by varying the voltage to a varactor in the tuned circuit thereby adjusting its operating frequency to a value representing the desired channel. This variable voltage, channel tuning approach is limited to application in the VHF and UHF broadcast bands.

An approach for tuning a television receiver to VHF, UHF and CATV channels is disclosed in U.S. Pat. No. 3,931,578 wherein is described a multiple frequency band receiver tuner system adapted to operate in a double frequency conversion mode and utilizing a single non-bandswitched local oscillator. In this approach frequency multiplying and/or frequency dividing stages are connected to the output of the local oscillator to provide the UHF and VHF-CATV mixer circuits with appropriate local oscillator frequencies to develop the desired IF frequencies. The approach of the '578 patent primarily involves the dual use of a tuned VHF RF amplifier as a tunable first IF amplifier stage in a UHF double conversion receiver which provides for the reception of multiple frequency bands. In addition, frequency multiplication of the single local oscillator output is utilized for reception of UHF while frequency division of the oscillator output is utilized for reception of the VHF low band.

Another multi-band tuner utilizing varactor diodes is disclosed in U.S. Pat. No. 3,564,423 wherein the varactor diodes are utilized not only for tuning in individual channels but also for bandswitching. In that approach de-coupling between the separate resonant circuits used in each frequency range is achieved by means of a plurality of bridge circuits with associated elements, the neutral branch of which includes the resonant circuit for the subsequently lower frequency range. Thus, resonant circuit de-coupling and improved tuning of the individual resonant circuits resulting therefrom is achieved in spite of the fact that the resonant circuits are always connected together. The '423 approach, while intended to avoid the undesirable effects of mechanical switching, fails to take advantage of current electronic switching technology and, as a result, suffers from undue complexity. U.S. Pat. No. 4,115,737 describes a system for receiving signals broadcast on two spaced bands each divided into several channels and makes use of two fixed band pass filters, one for each of the two frequency bands. U.S. Pat. No. 3,628,152 discloses a varactor diode tuning system intended to maintain a constant bandwidth as the system is tuned throughout its frequency range to avoid problems to bandwidth variation caused by changes in circuit capacitance. This tuning circuit is limited in application to tuning over the VHF and UHF broadcast bands.

The present invention represents a significant advance in the art because of its capability to tune to all VHF, UHF and CATV channels without utilizing a frequency converter, as required in currently available tuning systems. The present invention not only incorporates the advantages of electronic bandswitching but also permits easy inductor coil adjustment in facilitating tuning circuit alignment with a minimum number of components in a low cost tuner.

OBJECTS OF THE INVENTION

Accordingly, it is an object of the present invention to provide a novel multi-band television tuner.

Another object of the present invention is to provide a tuner capable of tuning to all VHF/UHF/CATV channels without the need for a frequency band conversion accessory for the television receiver.

Still another object of the present invention is to provide a single, easily aligned, all channel, voltage-controlled television tuner for operation over the VHF, UHF, and CATV bands.

A still further object of the present invention is to provide a single varactor tuner for operation in a VHF/UHF/CATV receiver in which automatic bandswitching is accomplished electronically.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, in which:

DESCRIPTION OF PREFERRED EMBODIMENT

A VHF television tuner must be capable of selecting any one of 12 VHF channels divided into two non-adjacent frequency bands. In accordance with the transmission standards existing in the United States, the first five channels (channels 2–6) fall within the low VHF band which extends from 54 to 88 MHz, while the remaining seven channels (channels 7–13) occupy the high VHF band of 174–216 MHz. Each channel extends over a bandwidth of 6 MHz and channels within each band are uniformly spaced. Television signals are also transmitted in the United States over 70 channels in the UHF band of 470–890 MHz. The UHF channels are numbered channels 14–83. In addition, an increasing number of television stations are broadcast over cable television (CATV) frequencies. These CATV frequencies include a mid-band frequency range of 120–174 MHz including channels A–I and a super-band frequency range of 216–300 MHz including channels J–W.

Figure 1:
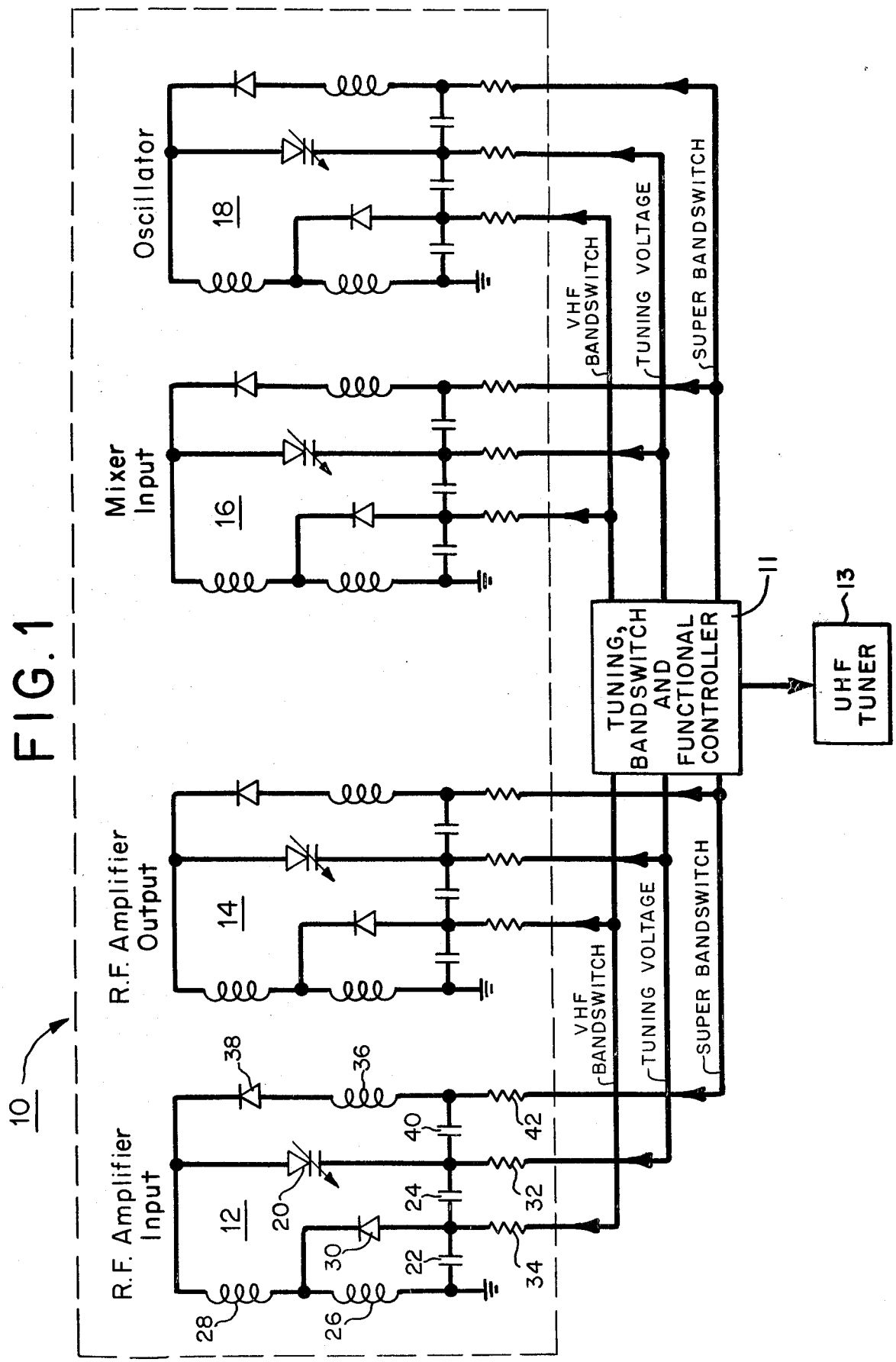
FIG. 1 is a simplified schematic representation of a VHF/UHF/CATV television tuner in accordance with a preferred embodiment of the present invention.

Referring to FIG. 1, there is shown a schematic representing a voltage-controlled tunable system 10 for selectively tuning a television receiver to any channel within the VHF, UHF and CATV frequency bands in accordance with a preferred embodiment of the present invention. Only that much of the circuitry as is necessary to fully understand the operation of the invention is shown in detail. Therefore, tuning, bandswitch and functional controller 11 from which tuner control and power voltages originate and UHF tuner 13, since both may be of conventional design, are shown merely as blocks in FIG. 1. Tunable means 10 is of the superheterodyne type having an RF amplifier and a variable frequency oscillator, the outputs of which are coupled to a mixer which in turn has a frequency selective output circuit to provide an intermediate frequency (or IF) signal which constitutes the tuner's output signal. Conditioning of tuner 10 to select a particular desired television channel requires the adjustment or tuning of four different tunable resonant circuits, shown in detail within block 10 and respectively designated by the reference numerals 12, 14, 16 and 18. Tuned circuits 12 and 14 are included in the input and output respectively of the RF amplifier stage. Resonant circuit 16 is included in the input of the mixer to form, in conjunction with the RF amplifier output resonant circuit 14, a double-tuned interstage coupling network from the output of the RF amplifier to the input of the mixer. Tunable circuit 18 constitutes part of the local oscillator and determines its operating frequency.

The composite television signal for a televised program includes two different RF carries separated in the frequency spectrum by 4.5 MHz. The lower frequency carrier is modulated by the picture or video information, including the color information if the program is transmitted in color, and the higher frequency IF carrier is modulated by the sound or audio information. When properly tuned to receive a given channel, each of the circuits 12, 14 and 16 will be tuned to resonate at the channel's center frequency, namely at the frequency midway between the two RF carriers of that channel. The oscillator-tuned circuit 18 is adjusted to resonate at a frequency appropriately higher than the center frequency by a fixed amount as determined by the intermediate frequency of the system. In accordance with the superheterodyne technique, the two RF carriers are converted to IF carriers in the mixer by beating or heterodyning the RF carriers with the local oscillator signal.

As shown in FIG. 1, each of the four tunable circuits 12, 14, 16 and 18 is preferably of similar construction; only the electrical values of the elements of circut 18 will differ from the others. A detailed description of circuit 12 will thus apply to all four. Circuit 12 comprises a voltage-controlled variable reactance device, in the form of a varactor or variable capacitance diode 20, shunt-connected via a pair of DC blocking capacitors 22 and 24 to an inductance means provided by a pair of series-connected inductance coils 26 and 28. A junction of coil 26 and capacitor 22 is connected to a plane of reference potential such as ground. Since capacitors 22 and 24 are provided merely for DC blocking, the frequency at which circuit 12 resonates will be determined primarily by the capacitance of varactor diode 20 and the inductance of coils 26 and 28. The capacitance presented by diode 20 is determined by the magnitude of an applied DC tuning voltage, developed in a manner to be explained. By varying the voltage amplitude level, that capacitance changes thereby changing the resonant frequency of the tunable circuit.

The resonant frequency is also influenced by the conductive condition of diode 30 which constitutes a switching device connected in shunt with coil 26. Diode 30 is controlled by an applied DC switching voltage which may have either one of two magnitude-polarity conditions—one of which renders diode 30 conductive while the other establishes the diode in its OFF position. The parameters of circuit 12 in the amplitude range over which the tuning voltage is adjusted are selected so that when diode 30 is turned OFF varactor diode 20 will be capable of tuning circuit 12 across the entire low VHF band, namely from 54 to 88 MHz. Selection of the circuit components and of the extent to which the tuning voltage is varied must also be made so that when switching diode 30 is turned ON (thus shorting out coil 26) circuit 12 will be tunable over the entire CATV mid-band of 120–174 MHz and the high VHF band of 174–216 MHz.

An adjustable amplitude-tuning voltage may be produced in a variety of different ways. A relatively simple scheme involves the use of a potentiometer as disclosed in U.S. Pat. No. 3,646,450. Since the present invention is capable of operating with any of the more conventional means for generating a tuning voltage and does not concern the generation of such voltage, a detailed description of the generation of such tuning voltage will not be provided here.

Similarly, the magnitude and polarity of the switching voltage may be supplied in a variety of different ways to effect automatic bandswitching of tuned circuits 12, 14, 16 and 18. For the reception of any one of channels 2-6 of the low VHF band the magnitude and polarity of the switching voltage will be appropriate to render the switching diodes non-conductive, while tuning to one of channels A-13 of the CATV mid-band and VHF high band results in the switching voltage having an amplitude and polarity to turn ON each of the switching diodes in each of the tuned circuits, consequently shorting out coil 26 and its three counterparts in circuits 14, 16 and 18. Adjustment of the input tuning voltage from one extreme to the other changes the capacitance of each of the varactor diodes to the extent necessary, with the cooperation of the switching diodes, to tune each of circuits 12, 14 and 16 across both VHF bands and CATV mid-band, and to tune circuit 18 over the appropriate frequency range to produce the required IF output signal.

Figure 2:
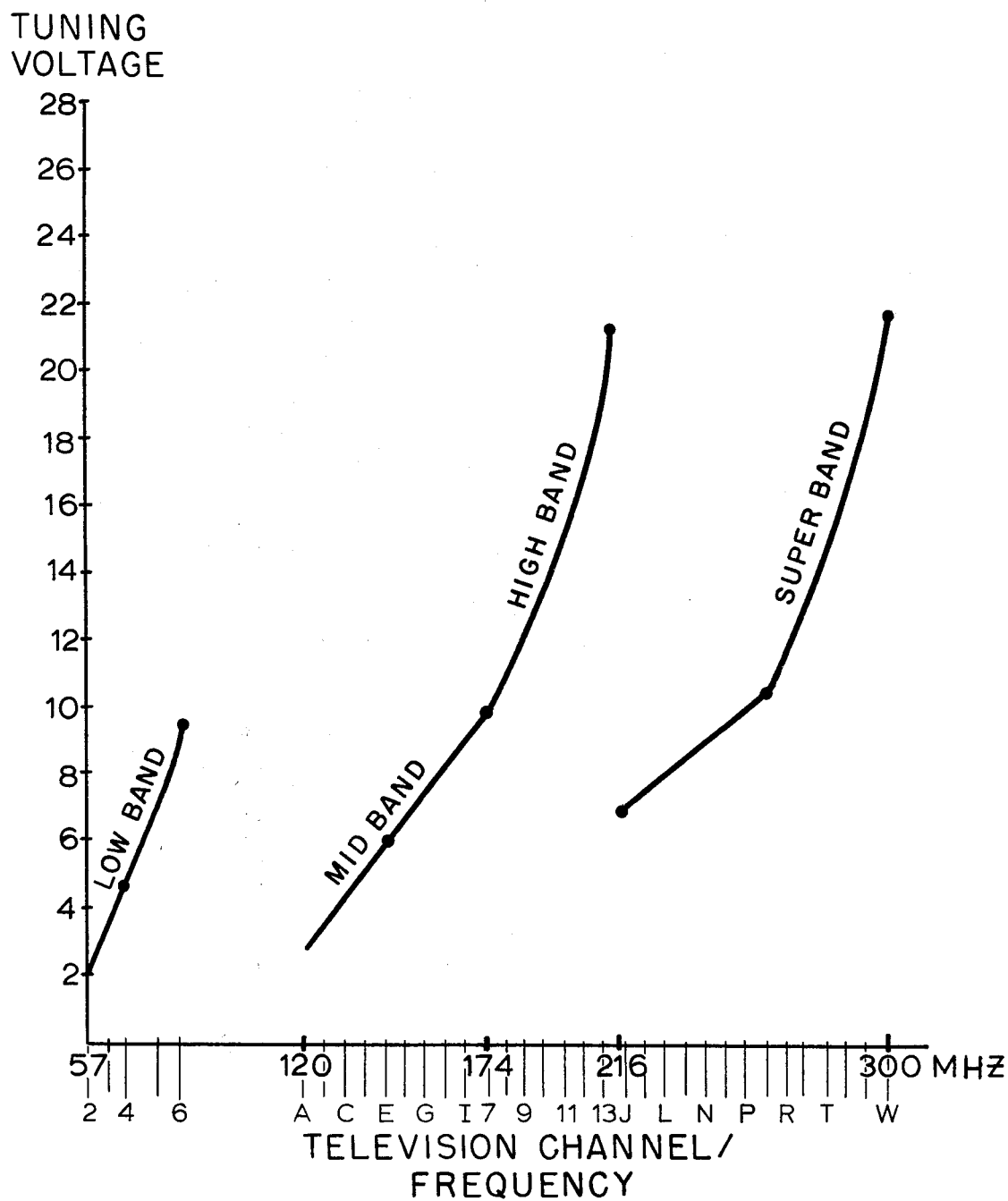
FIG. 2 illustrates the relationships between tuning voltage, individual television channels, and tuning bands in the VHF and CATV frequency regimes.

FIG. 2 illustrates the relationship between tuning voltage, individual television channels, and tuning bands in the VHF and CATV frequency regimes. UHF tuning parameters are not shown since the present invention envisions the use of a conventional UHF tuner in combination with conventional VHF/UHF bandswitching means. As indicated, one portion of the tuning voltage range 1-28 volts (specifically from 2 to approximately 9.5 volts) affects tuning to the low VHF channels 2-6, while another portion of the tuning voltage range (namely from approximately 2 to 22 volts) affects tuning to the CATV mid-band channels A-I and VHF channels 7-13. The magnitude and polarity of the switching voltage determines which of the two frequency bands is selected while a desired channel within a particular band is selected by means of tuning voltage amplitude. From FIG. 2, it can be seen that CATV mid-band is merely an extension (encompassing lower tuning voltages) of the VHF high band and that coverage of channels A through I is achieved by extending the range of the tuning voltage.

The tuning voltage provided to tuner 10 is connected via a series of four isolating resistors (resistor 32 and its three counterparts) to the varactor diodes of resonant circuits 12, 14, 16 and 18 in order to apply the tuning voltage to varactor diode 20 and its three counterparts. The VHF bandswitch signal is connected through a series of four isolating resistors (resistor 34 and its three counterparts) to each of the four switching diodes to apply the switching voltage thereto. Capacitor 22 and its three counterparts are included to provide DC blocking. The eight capacitors like 22 and 24 isolate the two DC voltages applied to each of the tuned circuits so that the tuning voltage will control only the varactors and so that the switching voltage will control only the switching diodes.

In accordance with the present invention, an inductive circuit is shunted across high-band VHF tuned circuitry to provide a CATV Superband capability. The shunted inductive circuit is made up of coil 36, switching diode 38, capacitor 40 and resistor 42. By means of a Superband switch voltage input, switching diode 38 is either in a forward or reversed bias state. With a forward bias applied to diode 38 Superband inductor 36 is shunted across the high VHF tuned circuit resulting in a lowering of the inductance of tuner circuit 10 producing a higher frequency range capability. Thus with diode 38 forward biased, Superband coil 36 and capacitor 40 are placed in parallel with the previously discussed high VHF band circuitry and an additional frequency band, i.e., the CATV Superband, is available. With a reverse bias applied, diode 38 is rendered non-conducting and Superband coil 36 is essentially removed from the tuned circuit and either VHF low-band or VHF high-band operation can be selected as previously discussed.

Referring to FIG. 2, the extended frequency coverage of the VHF tuner is shown by the addition of a third band, namely the Superband. By selectively incorporating the shunted Superband circuit, the operating frequency range is increased from 174-216 MHz to 216-300 MHz. In order for tuner 10 to operate in the Superband, switching diodes 30 and 38 must be forward biased to a conducting state. This effectively places inductor 36 in parallel with inductor 28. The resulting inductance (lower) increases the operating frequency range making acquisition of Superband channels possible. In order to tune to various Superband channels switching diodes 30 and 38 must be maintained in a forward biased, or conducting, state and the tuning voltage must be adjusted to tune to the desired Superband channel.

As in the case of VHF bandswitch voltages, the Superband switching voltages may be provided by any of the more conventional bandswitch voltage generation means, e.g., an electronic or microprocessor controlled arrangement of voltage sources as well as a mechanical arrangement of voltage supplies.

Following the forward bias voltage input to switching diodes 30 and 38 and the resulting shunting of coil 36 across the tuned circuit, conventional means are utilized to apply a variable voltage to varactor diode 20 in tuning to Superband channels J-W. By varying the voltage applied to varactor diode 20 the resonant frequency of tuner circuit 10 may be changed in a continuous manner over the entire frequency range of the CATV Superband. Capacitor 40, and its three counterparts in the remaining three resonant circuits, provides DC blocking of the Superband switch input voltage and the tuning voltage input. Capacitor 40 also provides isolation between the tuning voltage input and the Superband switch input so that the tuning voltage controls only varactor diode tuning while the Superband switch input voltage controls only switching diode 38. Resistor 42 performs a current limiting function and serves to isolate the four resonant circuits of tuner 10 from the Superband switch voltage source 11.

As shown in FIG. 2, a mid-band CATV channels A-I are acquired by a single extension of high band VHF tuning circuitry to encompass lower adjacent frequencies. The lower extension of the VHF high-band spectrum to encompass mid-band CATV channels is accomplished by utilizing high ratio varactor diodes in each of the four resonant tuning stages which permits a greater range of frequencies.

In switching from VHF to UHF operation, the appropriate VHF stages, i.e., the RF amplifier tunable resonant circuit 12 and oscillator tunable resonant circuit 18 circuits are turned off and the UHF RF amplifier, mixer and oscillator stages (not shown) are turned on. In addition, a switching diode (not shown) which delivers the UHF/IF signal to the VHF mixer stage (now an IF amplifier) is rendered conductive. Thus, the complete UHF to IF frequency translation function of the tuner is established. A tuning voltage supplied to the UHF varactor tuned circuits 13 selects the desired channel from 14 to 83. Also during UHF operation, the VHF tuned circuits are bandswitched to the VHF high-band to prevent self-resonances near the IF frequencies.

The invention provides, therefore, a novel VHF/UHF/CATV television receiver tuner with extended coverage of television channels both off the air and on cable television. While the present invention is disclosed in terms of covering the VHF, UHF and CATV Superband, it is not limited in its application to only the 105 channels presently located therein, but has application in tuning to higher numbered channels as they become available.

While particular embodiments of the present invention have been shown and described, it will be obvious to those skilled in the art that changes and modifications may be made without departing from the true invention and its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined from the following claims when viewed in their proper perspective against the prior art.

I claim:

1. In a tuner for tuning a television receiver to any one of several channels in a plurality of frequency bands, each of said frequency bands having a maximum and minimum frequency, a plurality of tunable resonant circuits, each of said tunable reasonant circuits comprising:
    low frequency band inductance coil means;
    medium frequency band inductance coil means, said medium band inductance coil means connected serially to said low band inductance coil means through a node;
    a voltage controlled variable reactance device, said variable reactance device coupled in parallel across said low and medium frequency band inductance coil means and coupled to a variable voltage source;
    first bias control means coupled between said node and a first DC biasing means for tuning to said medium band when said first bias control means is rendered conducting and for tuning to said low band when said first bias control means is rendered nonconducting by said first DC biasing means;
    high frequency band inductance coil means; and
    second bias control means connected serially to said high band inductance coil means and, in combination with said high band inductance coil means, coupled in parallel across said variable reactance device in combination with said medium band inductance coil means when said first bias control means is in a conductive state, said second bias control means being connected to a second DC biasing means such that when said second bias control means is rendered conductive by said second DC biasing means said high band inductance coil increases the resonant frequency of said tunable circuit thereby permitting said television receiver to be tuned to all channels in said high frequency band.

2. A tuner according to claim 1, wherein said plurality of tunable resonant circuits respectively coupled to an RF input amplifier, an RF output amplifier, a mixer stage and an oscillator with said variable reactance devices having substantially similar characteristics for providing frequency matching between said tunable resonant circuits.

3. A tuner according to claim 1, wherein said low frequency band includes VHF channels 2–6, said medium frequency band includes CATV channels A–I and VHF channels 7–13, and said high frequency band includes CATV channels J–W.

4. A tuner according to claim 1, wherein said first and second combinations of bias control means and biasing means each comprise a switching diode means coupled to a means for biasing said switching means in a conducting state when the DC voltage applied to said switching diode means exeeds a predetermined voltage level characteristic of said switching diode means.

5. A tuner according to claim 1, wherein said voltage-controlled, variable reactance devices in each of said tunable resonant circuits are varactor diodes.

6. A tuner according to claim 1 further comprising capacitive means coupling the combination of said low and medium inductance coils and said high inductance coil to said voltage-controlled, variable reactance device in each of said tunable resonant circuits to provide proper RF coupling and DC isolation between said parallel portions of said tuner.

7. In a tuner for tuning a television receiver to any one of several channels in a plurality of frequency bands each frequency band having a maximum and minimum frequency, said tuner including a plurality of tunable resonant circuits respectively coupled to an RF input amplifier, an RF output amplifier, a mixer stage and an oscillator, each of said tunable resonant circuits comprising:
    low frequency band inductance coil means for tuning to VHF channels 2–6;
    medium frequency band inductance coil means for tuning to CATV channels A–I and VHF channels 7–13, said medium band inductance coil and said low band inductance coil connected serially by means of a node;
    varactor diode means coupled in parallel across said serial combination of low and medium band inductance coil means, said varactor diode means being connected to a variable voltage source;
    first switching diode means coupled between said node and a first DC biasing means for tuning to said medium band when said first switching diode means is rendered conducting and for tuning to said low band when said switching diode means is rendered nonconducting by said first DC biasing means;
    high frequency band inductance coil means for tuning to CATV channels J–W;
    second switching diode means connected serially to said high band inductance coil means and, in combination with said high band inductance coil means, coupled in parallel across said varactor diode means, said second switching diode means being connected to a second DC biasing means such that when said first and second switching diode means are rendered conductive by said first and second DC biasing means respectively said high band inductance coil increases the resonant frequency of said tubular circuit thereby permitting said television receiver to be tuned to all CATV channels in said high frequency band; and
    a plurality of capacitive means coupling the combination of said low and medium frequency band inductance coil means and said high frequency band inductance coil means to said varactor diode means in each of said tunable resonant circuits to provide proper RF coupling and DC isolation between said parallel portions of said tunable circuits.

* * * * *